United States Patent [19]

Farrall et al.

[11] Patent Number: 5,008,912
[45] Date of Patent: Apr. 16, 1991

[54] X-RAY TUBE HIGH VOLTAGE CABLE TRANSIENT SUPPRESSION

[75] Inventors: George A. Farrall, Rexford, N.Y.; Steven D. Hansen, Port Washington, Wis.

[73] Assignee: General Electric Company, Milwaukee, Wis.

[21] Appl. No.: 417,353

[22] Filed: Oct. 5, 1989

[51] Int. Cl.⁵ .............................................. H05G 1/08
[52] U.S. Cl. ...................................... 378/91; 378/101; 378/194; 361/58; 333/33
[58] Field of Search ................. 378/101, 91, 102, 194, 378/111; 333/33; 361/58, 91

[56] References Cited

U.S. PATENT DOCUMENTS

| | | | |
|---|---|---|---|
| 1,645,643 | 10/1927 | Crook | 378/101 |
| 3,069,548 | 12/1962 | Bavor et al. | 250/103 |
| 3,197,719 | 7/1965 | Wells | 333/33 |
| 3,325,645 | 6/1967 | Splain | 250/103 |
| 3,636,355 | 1/1972 | James et al. | 250/102 |
| 3,668,465 | 6/1972 | Evans et al. | 315/107 |
| 4,172,269 | 10/1979 | Lickel et al. | 361/58 |
| 4,206,357 | 6/1980 | Franke | 378/111 |
| 4,208,584 | 6/1980 | Vogler et al. | 378/101 |
| 4,288,700 | 9/1981 | Grass et al. | 250/523 |
| 4,333,011 | 6/1982 | Mester | 378/111 |
| 4,704,630 | 11/1987 | Rodda | 358/160 |
| 4,761,804 | 8/1988 | Yahata | 378/111 |
| 4,768,215 | 8/1988 | Kiwaki et al. | 378/101 |

OTHER PUBLICATIONS

A. E. Kennelly, Artificial Electric Lines, 1917, Chapter 3, pp. 15 to 23.
1960 Text of Richard Moore entitled Traveling-Wave Engineering.

Primary Examiner—Edward P. Westin
Assistant Examiner—Kim-Kwok Chu
Attorney, Agent, or Firm—Quarles & Brady

[57] ABSTRACT

An X-ray imaging system includes an X-ray tube, which is biased by a high voltage power supply connected to the tube by one or two shielded cables which have a characteristic impedance. The cables are coupled to the X-ray tube by a resistance which is substantially equal to the characteristic impedance when a single cable is used or to twice the characteristic impedance when two cables are used. During a breakdown of the X-ray tube, the resistance depresses electrical current flow between the anode and the cathode of the tube. This current is in part due to the energy stored in the cable, which is not depressed by conventional current limiting circuits in the high voltage power supply.

14 Claims, 3 Drawing Sheets

X-RAY TUBE HIGH VOLTAGE CABLE TRANSIENT SUPPRESSION

BACKGROUND OF THE INVENTION

The present invention relates to X-ray imaging apparatus, and more specifically to means of depressing transient current surges through an X-ray tube of the apparatus.

The X-ray imaging apparatus includes a vacuum tube, having a cathode and anode, which emits X-rays during operation. The cathode comprises tungsten thermionic emitting source and focusing surfaces. Upon application of an applied potential the thermionically emitted electrons traverse the vacuum gap between the cathode and anode, impacting the anode thereby generating X-rays.

Occasionally, during normal operation, the vacuum tube will break down, resulting in an abrupt drop in anode to cathode impedance and the passage of a large current through the tube. Over a period of time, repeated breakdowns cause a deterioration of the high voltage electrodes and a reduction in the ability of the X-ray tube to withstand the high bias voltage needed to produce X-rays. Although the tube's power source, or generator, under normal operating conditions has the capability of regulating the flow of current between the anode and cathode, this control is lost during a breakdown.

In a typical medical diagnostic X-ray installation, the X-ray tube and its associated imaging components are often located in one room and the high voltage power generator in another. These components are interconnected by high voltage cables which may be up to 100 feet in length. Usually one shielded cable connects the cathode to a negative (with respect to ground) high voltage supply, and another shielded cable connects the anode to a positive (with respect to ground) high voltage supply. Normally these cables serve as passive elements transferring power between the supplies and X-ray tube, but due to the characteristics of the cable reactance, the energy stored in them can be substantial.

However, in the case of a tube breakdown, the high voltage cables actively participate in the event. Since the cables have significant capacitance and inductance, the breakdown initiates an oscillatory discharge between the anode and cathode cables which now are electrically connected through the low impedance path of the X-ray tube. High transient currents are limited only by the cables surge impedance rather than by limiting impedances of the power source. The electrical discharge, which results from the breakdown, has a periodically changing polarity and damages both the cathode and anode surfaces within the tube. The discharge eventually is extinguished, either by damping which results from resistive elements in the cables or by extinction of the discharge conducted through the gap during a zero current crossing of the oscillation. The resulting damage can greatly impair the ability of the X-ray tube to withstand normal voltages during subsequent operation.

SUMMARY OF THE INVENTION

An X-ray imaging apparatus includes a vacuum tube having a cathode and anode for the production of an X-ray beam. The apparatus further includes a source for generating and maintaining a high voltage potential during the operation of the X-ray tube.

In the preferred embodiment, the source preferably has separate high voltage power supplies for the anode and cathode of the tube. The X-ray tube is electrically connected to the source by high voltage cables, one connecting the anode power supply to the anode of the X-ray tube and another connecting the cathode power supply to the cathode of the X-ray tube. A resistive element is connected in series with the X-ray tube between the two cable and has a resistance equal to twice the characteristic impedance of the cables. The resistive element suppresses transient currents passing between the anode and cathode cables.

In another embodiment of the present invention, a single cable is employed to couple the X-ray tube to the source of high voltage. The cathode is grounded and the cable contains a conductor which connects the anode to a positive high voltage supply. In this alternative, a resistive element is connected in series with the X-ray tube at the remote end of the cable from the high voltage supply and has a resistance equal to the characteristic impedance of the cable.

The object of the present invention is to limit the current flow through an X-ray tube during a breakdown condition, enabling the X-ray tube to return to a dielectric condition required for further operation.

Another object is to provide a mechanism between the X-ray tube and cables from the high voltage source so that the energy stored in the cables will not produce a damaging current during the breakdown condition.

DETAILED DESCRIPTION OF THE INVENTION

Figure 1:
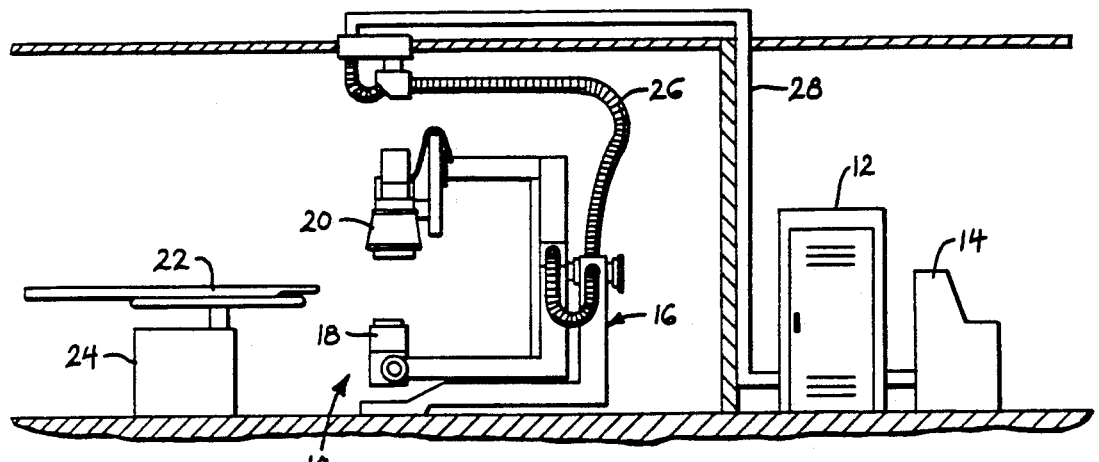
FIG. 1 is pictorial representation of an X-ray apparatus incorporating the present invention.

With initial reference to FIG. 1, an X-ray imaging apparatus, generally designated as 10, is illustrated installed in two rooms of a building, such as a hospital or medical clinic. Within one room is a high voltage generator, 12 and an x-ray control console 14. As will be described, the generator 12 typically includes separate positive and negative power supplies. Within the other room is a gantry arrangement 16 on which the X-ray tube assembly 18 and X-ray detection assembly 20 are mounted. The X-ray detection assembly 20 consists of a film holder and a video camera, or in the case of computed tomography an X-ray detector which converts X-ray intensity into electrical signals. Electrical cables, that transfer power and control signals, extend through a flexible conduit 26 and a rigid conduit 28 from the components mounted on the gantry 16 to the high voltage generator 12 and the control console 14.

An X-ray transmissive table 22, for supporting a patient being examined, is positioned adjacent to the gantry 16. The table 22 is mounted on a support 24 in a manner that enables the table to slide between the X-ray tube assembly 18 and the X-ray detection assembly 20.

Figure 2:
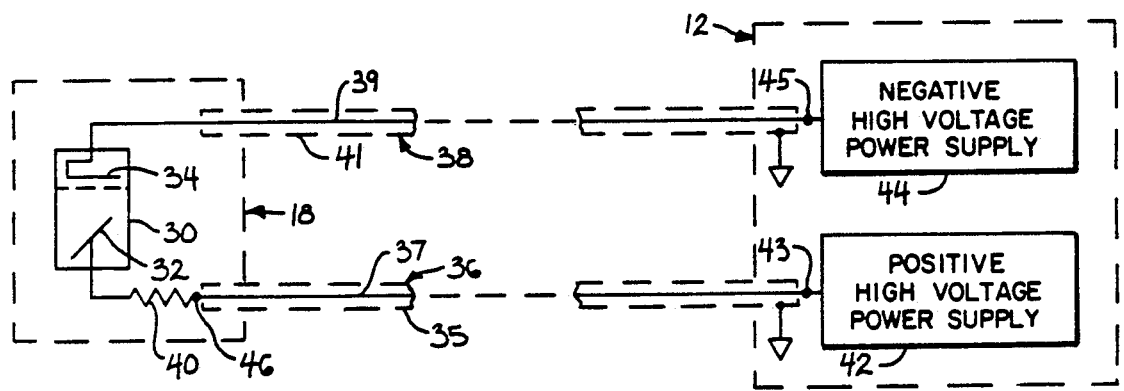
FIGS. 2-4 are three different embodiments of the X-ray apparatus circuit which couple a high voltage generator to the anode and cathode of the X-ray tube using two high voltage cables.

FIG. 2 schematically illustrates the high voltage connection of the X-ray tube assembly 18 to the generator 12 by two cables 36 and 38. The high voltage generator 12 consists of several individual circuits for supplying different voltages and currents to assembly 18 and its X-ray emissive vacumm tube 30. In particular, the generator 12 includes separate positive and negative high voltage power supplies 42 and 44, which as their names imply produce positive and negative voltages, with respect to ground, at terminals 43 and 45, respectively. The potential difference between terminals 43 and 45 is 150,000 volts, for example. Although not illustrated, the high voltage generator 12 also includes a tube filament current supply and a grid bias voltage supply.

The two high voltage cables 36 and 38 connected to the generator 12 have up to four center conductors surrounded by high voltage insulation and a grounded conductive shield 35 and 41 around the outer circumference. The center conductors 37 of the anode cable 36 are shorted together at the ends with one end of these conductors connected to terminal 43 of the positive high voltage power supply 42 and the other end connected to terminal 46 of the X-ray tube assembly 18. The cathode cable 38 includes a center conductor 39 connected at one end to terminal 45 of the negative high voltage supply to receive a common cathode potential. The other center conductors (not shown) of the cathode cable 38 carry current to one or more thermionic emitters in the X-ray vacuum tube 30 and in some cases supply a tube grid potential. Those center conductors of the cathode cable 38 not used in a given application are shorted to a common center conductor.

In a typical installation, the high voltage anode and cathode cables 36 and 38 extend 100 feet or more between the high voltage generator 12 and the X-ray tube 30 within assembly 18. According to transmission line theory, such lengthy cables can be modeled as the summation of a series of infinitely small distributed inductances and capacitances, thereby having the ability to store substantial energy when an operating potential is supplied to the tube. The anode and cathode cables 36 and 38 have the same characteristic, or surge, impedance. The characteristic impedance of a high voltage cable is independent of its length and is equal to the inductance of the cable per unit length divided by the capacitance of the cable per unit length.

The X-ray tube assembly 18 contains an X-ray tube 30 with an anode 32 and a cathode assembly 34 separated by a vacuum gap. The center conductor 39 of the high voltage cathode cable 38 is connected directly to the cathode assembly 34, thereby applying the potential from the negative high voltage power supply 44 to the cathode assembly. A transient suppression resistor 40 couples the center conductors 37 of the high voltage anode cable 36 to the anode 32 of the X-ray tube. This coupling applies the potential from the positive high voltage power supply 42 to the anode 32.

The resistance of resistor 40 is substantially twice the characteristic impedance of the anode and cathode cables 36 and 38. The inductance of the resistor 40 must be significantly less than that of the cables (e.g. less than 0.01 milliHenrys), so as not to change the apparent characteristics of the anode cable 36 at the termination 46 in the X-ray tube assembly 18. In a typical application with an applied operating potential of 150,000 volts between the anode 32 and the cathode assembly 34, the resistor 40 must be capable of continuously dissipating the heat generated by Joule heating (approximately 150 Watts including a safety factor), and must be capable of handling electrical transient currents of up to 1,500 amperes for at least 0.5 microseconds. In order to meet these requirements, resistor 40 in practice may consist of several resistors connected in series.

Figure 3:
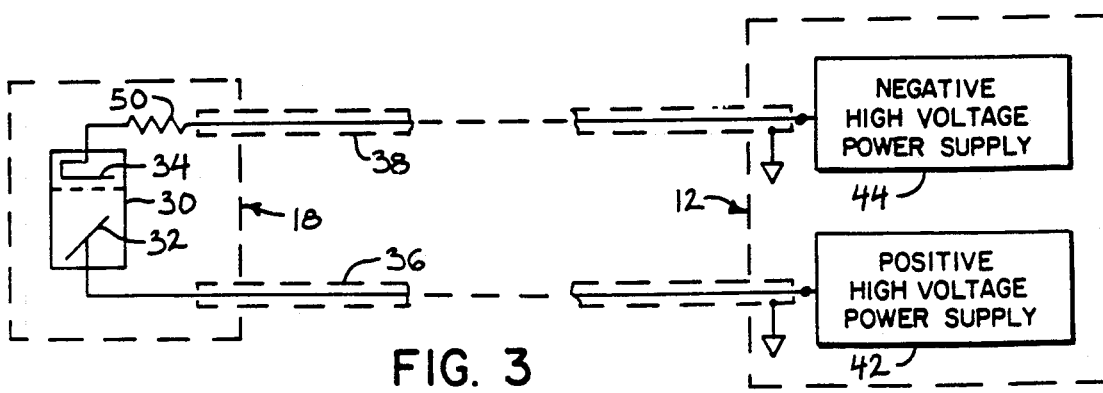

With reference to FIG. 3, an alternative embodiment of the present invention is shown in which a transient suppression resistor 50 is electrically connected in series between the high voltage cathode cable 38 and the cathode assembly 34. In this embodiment, the resistance of the resistor 50 also is substantially twice the characteristic impedance of the high voltage anode and cathode cables 36 and 38. As noted above, the cathode cable may be comprised of several individual conductors, electrically isolated from each other. In this case, additional transient suppression resistors must be provided for each of these conductors, with each resistor connected electrically in series between the high voltage cathode cable 38 and the corresponding component of the tube assembly 18.

Figure 4:
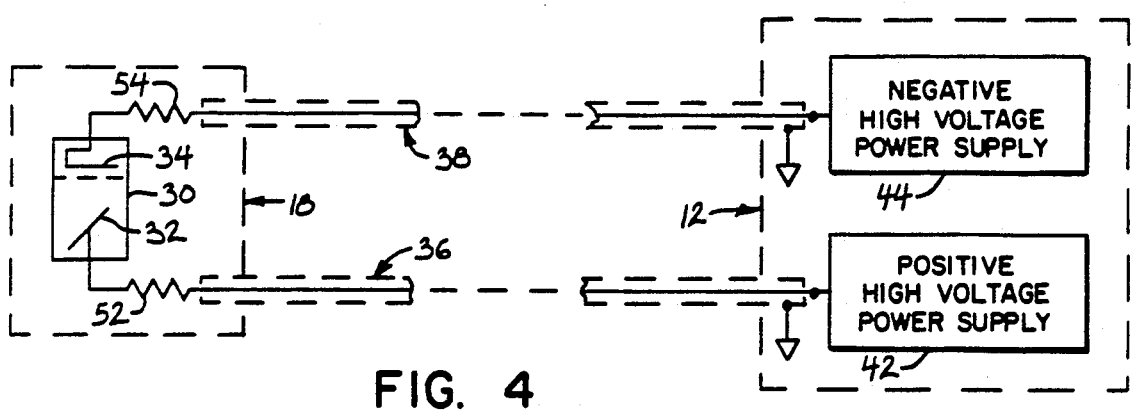

FIG. 4 illustrates a third embodiment in the present invention in which the high voltage anode cable 36 is electrically coupled to the anode 32 by a first series resistor 52 and the high voltage cathode cable 38 is electrically coupled to the cathode assembly 34 by a second series resistor 54. In this latter embodiment, the sum of the resistance of resistors 52 and 54 is substantially equal to twice the characteristic impedance of the two high voltage cables, since during X-ray tube breakdown, they are electrically in series.

Figure 5:
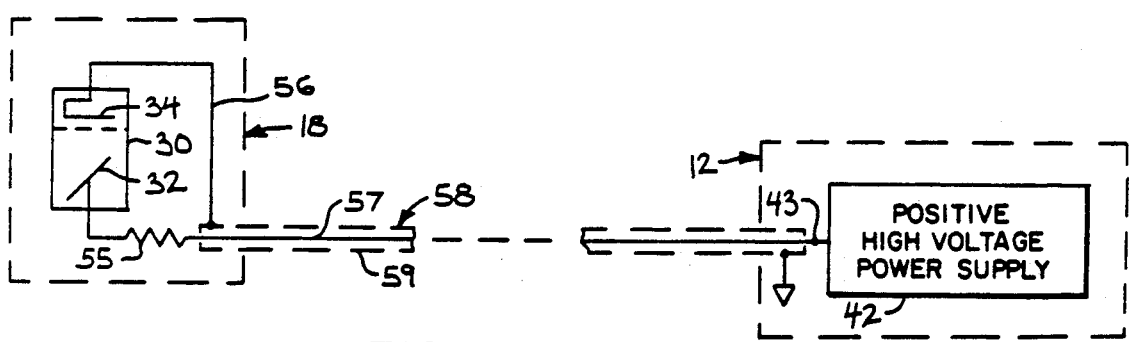
FIG. 5 is another embodiment of a circuit for coupling the high voltage generator to an X-ray tube having a cathode which operates at ground potential.

Referring to FIG. 5, a special case of the present invention utilizes a high voltage generator 12 which has a positive (with respect to ground) high voltage power supply 42, but does not include the negative power supply 44 of the previous embodiments. The positive high voltage power supply 42 is connected to a central conductor 57 of a high voltage cable 58 at the supply terminal 43. The central conductor 57 is coupled to the X-ray tube anode 32 by a series resistor 55 having a resistance substantially equal to the characteristic impedance of the high voltage cable 58. The cathode assembly 23 is held at essentially ground potential by a connection 56 to the grounded shield 59 of cable 58.

The location of resistor 55 may be varied in a manner similar to the embodiments in FIGS. 2-4. Specifically, resistor 55 can be connected to the cathode assembly 34 as part of connection 56, or separate resistors whose summed resistance equals the characteristic impedance of the cable 58 can be connected in at both the cathode and the anode.

Each of the embodiments of the present invention places a resistance between the high voltage cable (or cables) and the X-ray tube. The value of this resistance is selected to optimally depress tube breakdown current. The number of high voltage cables determines the optimum value of the resistance. When as in FIGS. 2-4, the anode and cathode voltage conductors (37 and 39) are enclosed by separate grounded shields (35 and 41), the optimum resistance is substantially twice the characteristic impedance of the two cables (36 and 38). However, when a single cable (58) is used as in FIG. 5, the optimum transient depression resistance is equal to the characteristic impedance of the cable.

Figure 6:
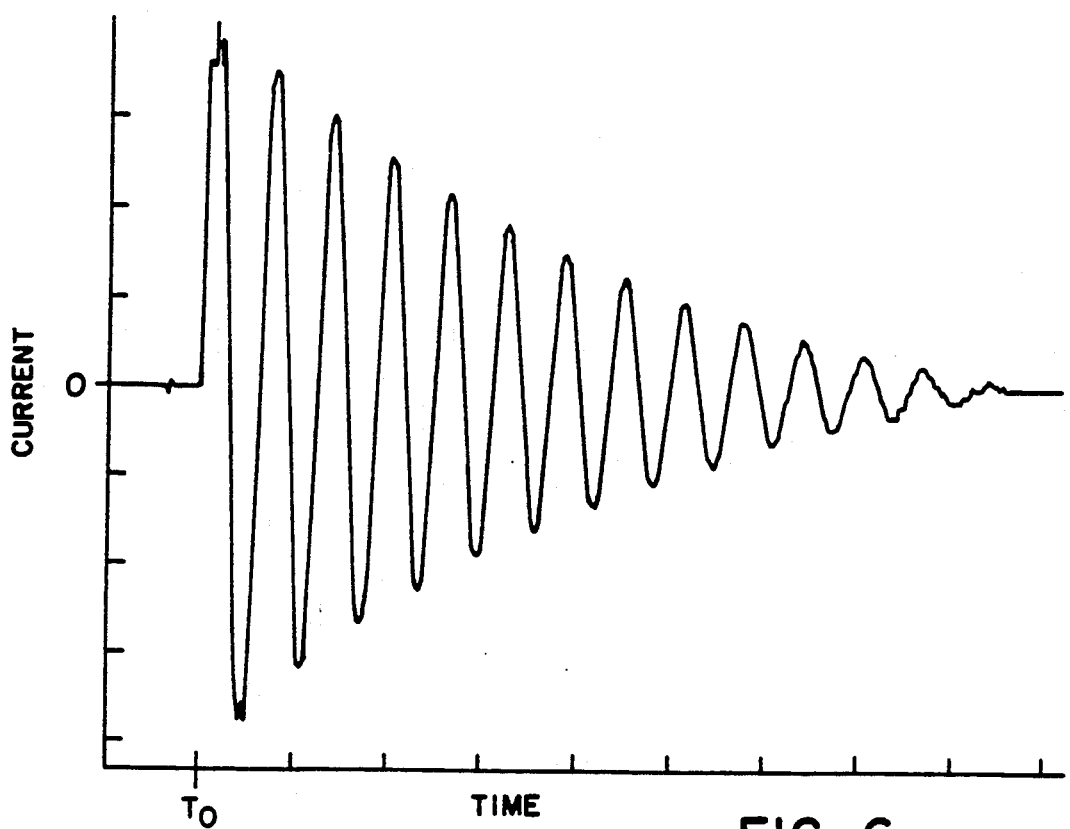
FIGS. 6 and 7 depict the typical breakdown current through an unterminated cable and on terminated according to the present invention.
Figure 7:
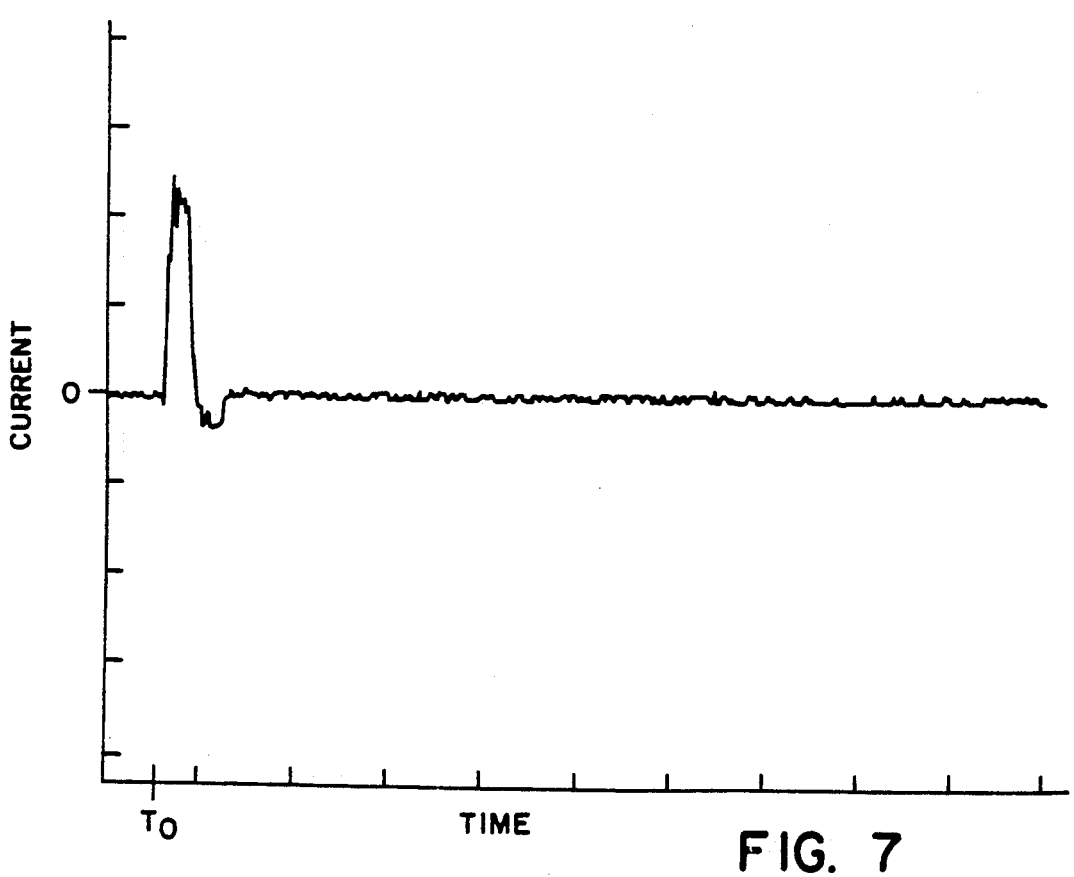

The beneficial effects of the transient depression resistive element (e.g. resistor 40) are shown by a comparison of the current waveforms in FIGS. 6 and 7. Both waveforms represent the tube breakdown through a high current arc between two sixty foot long high voltage anode and cathode cables 36 and 38 each having a characteristic impedance of 42 ohms and connected as shown in FIG. 2. The waveform in FIG. 6 illustrates the typical breakdown current oscillations that propagate between cables 36 and 38 through an X-ray tube assembly 18 without a resistor 40. Prior to the breakdown at time $T_0$, a relatively small current flows through the tube from the anode 32 to the cathode assembly 34 (electrons flow from the cathode assembly 34 to the anode 32). When an X-ray tube assembly 18 is at an operating potential of 150,000 volts and a breakdown occurs, the energy stored in the capacitance of the high voltage cables 36 and 38 is released and a peak current of approximately 1,500 amperes flows. The current oscillates through the X-ray tube 30, due to the characteristics of the reactance of the high voltage cables, while decaying in magnitude with each cycle. Although the breakdown current in the X-ray tube 30 may last for only a few microseconds, repeated tube breakdowns of this nature have an adverse cumulative effect on the life of the X-ray tube electrodes.

FIG. 7 depicts the breakdown current under the same conditions as represented in FIG. 6, except for the insertion of an 84 ohm resistance between and in series with the high voltage cables 36 and 38 and the X-ray tube 30, as shown by the circuit of FIG. 2. This resistance is twice the characteristic impedance (42 ohms) of the cables. Now, when the breakdown occurs at time $T_0$, a significantly smaller peak current initially flows through the X-ray tube 30. The breakdown current is critically damped so that after the initial current surge, no oscillation is observed between the high voltage cables. As compared to the unsuppressed system in FIG. 6, the present invention provides a twofold benefit by first reducing the peak current that flows through the X-ray tube 30 and secondly by preventing the oscillation between the high voltage cables. These benefits in turn, prolong the life of the X-ray tube.

Referring to the embodiments in FIGS. 2-4, if the resistance between the high voltage cables 36 and 38 and the X-ray tube 30 is significantly greater than two times the cable characteristic impedance, overdamping occurs and although peak breakdown current is reduced the applied tube potential very slowly decays to zero. This slow decay promotes re-ignition of the breakdown for an extended period of time potentially resulting in greater damage to the cathode. If the resistance used in these embodiments is significantly less than two times the characteristic impedance of the cables, the breakdown is underdamped leading to less than optimum peak current suppression and some current oscillation.

Therefore, for optimum suppression of breakdown current in the X-ray tube circuits in FIGS. 2-4, the resistive element should have a resistance which is substantially equal to twice the characteristic impedance of the cable when the anode and cathode voltage conductors are enclosed by separate shields. In a situation where a single commonly shielded cable is used as in FIG. 5, a transient suppression resistance substantially equal to the cable's characteristic impedance provides breakdown current protection. If a resistor cannot be found at the exact optimum resistance, a resistor having close to the optimum resistance can be employed.

Although the present technique has been described in the context of an X-ray system, the problems which are addressed are found in other systems as well. As a consequence, the instant transient suppression approach can be applied to other types of electronic devices. In any system that employs transmission lines coupled to an electronic device, such as a klystron, thyratron or even a solid state switch, higher than normal currents may occur as a result of momentary device failure or a failure in an associated circuit component. In such cases, the useful life of the electronic device can be severely curtailed, and may warrant the inclusion of the transient suppression suggested here. In the particular case of solid state devices, which have severe limits on resistive power dissipation that can be tolerated without irreparable damage, the voltage may not be particularly high, but impedance-matched current suppression would be especially effective.

We claim:

1. An X-ray imaging system comprising:
   a vacuum tube for emitting an X-ray beam and having an anode and a cathode;
   means, having first and second terminals, for producing a DC potential across the terminals;
   a cable means for applying the DC potential from said means for producing to said vacuum tube, said cable means having a characteristic impedance and storing electrical energy as a result of applying the DC potential; and
   a resistive means, coupling said cable means to said vacuum tube, for depressing transient currents flowing through said vacuum tube under a breakdown condition.

2. The X-ray imaging system as recited in claim 1 wherein said resistive means has a resistance which is substantially twice the characteristic impedance of said cable means.

3. The X-ray imaging system as recited in claim 2 wherein:
   said cable means includes a first conductor coupled to the first terminal, a first grounded conductive shield around the first conductor, a second conductor connected to the second terminal and the cathode, and a second grounded conductive shield around the second conductor; and
   said resistive means is coupled between the first conductor and the anode.

4. The X-ray imaging system as recited in claim 2 wherein:
   said cable means includes a first conductor connected to the first terminal and the anode, a first grounded conductive shield around the first conductor, a second conductor connected to the second terminal, and a second grounded conductive shield around the second conductor; and
   said resistive means is coupled between the second conductor and the cathode.

5. The X-ray imaging system as recited in claim 2 wherein:
   said cable means includes a first conductor connected to the first terminal, a first grounded conductive shield around the first conductor, a second conductor connected to the second terminal, and a second grounded conductive shield around the second conductor; and
   said resistive means includes a first resistive element coupled between the first conductor and the anode, and a second resistive element coupled between the second conductor and the cathode.

6. The X-ray imaging system as recited in claim 5 wherein each of the resistive elements has a resistance substantially equal to the characteristic impedance of said cable means.

7. The X-ray imaging system as recited in claim 1 wherein:
said cable means includes a conductor coupled to the first terminal, a grounded conductive shield around the conductor, and means for coupling the cathode to substantially ground potential; and
said resistive means connected in series with said vacuum tube between the conductor and the means for coupling, and having a resistance substantially equal to the characteristic impedance.

8. The X-ray imaging system as recited in claim 7 wherein the means for coupling connects the cathode to said conductive shield.

9. An X-ray imaging system comprising:
a vacuum tube for emitting an X-ray beam and having an anode and a cathode;
a first source of a positive potential with respect to ground;
a second source of a negative potential with respect to ground;
a first cable having a first conductor connected to said first source and a first conductive shield around the first conductor, wherein said first cable has a characteristic impedance $R_c$;
a second cable having a second conductor connected to the second source and a second conductive shield around the second conductor, wherein said second cable has a characteristic impedance substantially equal to the characteristic impedance $R_c$ of said first cable; and
a means for coupling the first conductor to the anode of said vacuum tube and for coupling the second conductor to the cathode of said vacuum tube, said means for coupling having a resistance that is substantially twice the characteristic impedance $R_c$.

10. An apparatus comprising:
an electronic device having a first and second electrodes which are biased by a DC potential;
a source of DC potential having first and second terminals across which the DC potential is produced;
a cable means for applying the DC potential from said source to said electronic device, and having a first conductor coupled to the first terminal and a first conductive shield around the first conductor, the first conductor and the first conductive shield having a characteristic impedance; and
a resistive element, coupling the first conductor to the first electrode, for depressing transient currents flowing through said electronic device.

11. The apparatus as recited in claim 10 wherein said resistive element has a resistance which is substantially equal to the characteristic impedance.

12. The apparatus as recited in claim 10 wherein said cable means further includes:
a second conductor coupled between the second terminal and the second electrode; and
a second conductive shield around the second conductor, the second conductor and the second conductive shield having substantially the same characteristic impedance as the first conductor and the first conductive shield.

13. The apparatus as recited in claim 12 wherein said resistive element has a resistance which is substantially twice the characteristic impedance.

14. The apparatus as recited in claim 12 further comprising another resistive element coupling the second conductor to the second electrode, wherein the sum of the resistances of the resistive elements is substantially equal to twice the characteristic impedance.

* * * * *